US012776815B2

(12) United States Patent
Moradinia et al.

(10) Patent No.: US 12,776,815 B2
(45) Date of Patent: Oct. 27, 2026

(54) D-BAND VECTOR MODULATOR PHASE-SHIFTER WITH DELAY LINE-BASED DIFFERENTIAL QUADRATURE GENERATION

(71) Applicant: Georgia Tech Research Corporation, Atlanta, GA (US)

(72) Inventors: Arya Moradinia, Atlanta, GA (US); John D. Cressler, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 306 days.

(21) Appl. No.: 18/586,770

(22) Filed: Feb. 26, 2024

(65) Prior Publication Data

US 2024/0291533 A1 Aug. 29, 2024

Related U.S. Application Data

(60) Provisional application No. 63/486,820, filed on Feb. 24, 2023.

(51) Int. Cl.
*H04B 7/06* (2006.01)
*H03G 3/30* (2006.01)
(Continued)

(52) U.S. Cl.
CPC ......... *H04B 7/0617* (2013.01); *H03G 3/3036* (2013.01); *H03K 5/01* (2013.01); *H04B 1/40* (2013.01); *H01Q 3/2694* (2013.01); *H01Q 3/28* (2013.01); *H03K 2005/00078* (2013.01); *H03K 2005/00286* (2013.01)

(58) Field of Classification Search
CPC ...... H04B 7/0617; H04B 1/40; H03G 3/3036; H03K 5/01; H03K 2005/00078; H03K 2005/00286; H01Q 3/2694; H01Q 3/28
See application file for complete search history.

(56) References Cited

U.S. PATENT DOCUMENTS

| | | | | |
|---|---|---|---|---|
| 9,093,984 | B1 * | 7/2015 | Hageman | H03H 11/36 |
| 11,283,409 | B2 * | 3/2022 | Leung | H03F 3/245 |

FOREIGN PATENT DOCUMENTS

| | | | |
|---|---|---|---|
| CN | 113810022 A * | 12/2021 | H03H 11/16 |
| CN | 114641929 A * | 6/2022 | H04B 1/40 |

OTHER PUBLICATIONS

A. Karakuzulu, M. H. Eissa, D. Kissinger, and A. Malignaggi, "Full D-Band Transmit-Receive Module for Phased Array Systems in 130-nm SiGe BiCMOS," IEEE Solid-State Circuits Letters, vol. 4, pp. 40-43, 2021.

(Continued)

*Primary Examiner* — Curtis A Kuntz
(74) *Attorney, Agent, or Firm* — Meunier Carlin & Curfman LLC

(57) ABSTRACT

An exemplary system and method are disclosed that employs a multi-bit D-band vector modulator phase shifter that couples to a transmission line-based delay input line structure for a phased array circuit. The exemplary system and method can generate differential quadrature signals that can be weighted by amplifiers and cascaded with a buffer amplifier to achieve wide bandwidth, moderate gain, and low power consumption. Tapered delay lines may be employed at the input for differential quadrature signal generation to achieve wider bandwidth than other vector modulator phase shifter at D-Band.

16 Claims, 10 Drawing Sheets

(51) Int. Cl.

| | |
|---|---|
| ***H03K 5/01*** | (2006.01) |
| ***H04B 1/40*** | (2015.01) |
| *H01Q 3/26* | (2006.01) |
| *H01Q 3/28* | (2006.01) |
| *H03K 5/00* | (2006.01) |

(56) References Cited

OTHER PUBLICATIONS

D. d. Rio et al., "A D-Band 16-Element Phased-Array Transceiver in 55-nm BiCMOS," IEEE Transactions on Microwave Theory and Techniques, pp. 1-0, 2022.

S. Afroz and K. J. Koh, "A D-Band Two-Element Phased-Array Receiver Front End With Quadrature-Hybrid-Based Vector Modulator," IEEE Microwave and Wireless Components Letters, vol. 28, No. 2, pp. 180-182, 2018.

P. V. Testa, C. Carta, and F. Ellinger, "A 160-190-GHz VectorModulator Phase Shifter for Low-Power Applications," IEEE Microwave and Wireless Components Letters, vol. 30, No. 1, pp. 86-89, 2020.

D. Pepe and D. Zito, "Two mm-Wave Vector Modulator Active Phase Shifters With Novel IQ Generator in 28 nm FDSOI CMOS," IEEE Journal of Solid-State Circuits, vol. 52, No. 2, pp. 344-356, 2017.

S. Afroz and K. J. Koh, "W-Band (92-100 GHz) Phased-Array Receive Channel With Quadrature-Hybrid-Based Vector Modulator," IEEE Transactions on Circuits and Systems I: Regular Papers, vol. 65, No. 7, pp. 2070-2082, 2018.

D. d. Rio, I. Gurutzeaga, R. Berenguer, I. Huhtinen, and J. F. Sevillano, "A Compact and High-Linearity 140-160 GHz Active Phase Shifter in 55" "nm BiCMOS," IEEE Microwave and Wireless Components Letters, vol. 31, No. 2, pp. 157-160, 2021.

* cited by examiner

| Reference | [3] | [4] | [5] | [6] | [7] | **This Work** |
|---|---|---|---|---|---|---|
| Technology | 130 nm SiGe | 130 nm SiGe | 28 nm SOI | 130 nm SiGe | 55 nm SiGe | **90 nm SiGe** |
| Topology | Switching + Quadrature Combining + Buffers | Gilbert cell + Triple Cascode | Active 90° IQ Signal Generation | Switching + Quadrature Combining + Buffers | Gilbert Cell | **Delay Line + Buffer** |
| Center Frequency (GHz) | 115 | 176 | 87.4 | 96 | 150 | **127.5** |
| 3-dB Bandwidth (GHz) | - | 28 | 14 | - | 20 | **35** |
| Fractional Bandwidth (%) | - | 16 | 16 | - | 13 | **27.5** |
| Peak Average Gain (dB) | +13 | -6.2 | +2.3 | +10.5 | -4.5 | **+1.5** |
| Peak RMS Gain Error (dB) | 1.6 | 1 | 2 | 1.8 | 1.4 | **1.2** |
| Peak RMS Phase Error (°) | 5.5 | 8 | 11.9 | 5 | 7.5 | **8.5** |
| Resolution (bits) | 4 | 4 | 4 | 5 | 5 | **4** |
| $IP_{1dB}$ (dBm) | -22* | -13.5* | -8 | -13.6 | +2 | **-9** |
| Average $P_{DC}$ (mW) | 53 | 12.4 | 21.6 | 31 | 50 | **20.3** |
| Core Die Area ($mm^2$) | 0.83 | 0.07 | 0.12 | - | 0.05 | **0.81** |

*simulation

*FIG. 6*

D-BAND VECTOR MODULATOR PHASE-SHIFTER WITH DELAY LINE-BASED DIFFERENTIAL QUADRATURE GENERATION

RELATED APPLICATION

This application claims priority to, and the benefit of, U.S. Provisional Patent Application No. 63/486,820, filed Feb. 24, 2023, entitled "D-BAND VECTOR MODULATOR PHASE-SHIFTER WITH DELAY LINE-BASED DIFFERENTIAL QUADRATURE GENERATION," which is incorporated by reference herein in its entirety.

BACKGROUND

High-performance, wideband mm-wave transceivers can operate at D-Band (110-170 GHZ) to provide greater available bandwidth that can enable high data rate communications. One feature of using mM-wave frequencies for wireless communications is the greater path loss resulting from atmospheric attenuation. This typically requires that phased arrays be utilized to achieve acceptable, effective isotropic radiated power (EIRP) and beam steering over long distances.

There is a benefit to improving phased array implementations for mm-wave devices and other applications described herein.

SUMMARY

An exemplary system and method are disclosed that employs a multi-bit D-band vector modulator phase shifter that couples to a transmission line-based delay input line structure for a phased array circuit. The exemplary system and method can generate differential quadrature signals that can be weighted by amplifiers and cascaded with a buffer amplifier to achieve wide bandwidth, moderate gain, and low power consumption. Tapered delay lines may be employed at the input for differential quadrature signal generation to achieve wider bandwidth than other vector modulator phase shifters at D-Band.

The exemplary system and method may be employed as a phase shifter in a D-Band phased array transceiver geared towards communications applications such as 6G Cellular Communications (>100 GHZ) as well as Next Generation Wi-Fi and/or Internet of Things (IoT) applications (wearable sensors). The wider bandwidth can provide higher-speed communications than other mm-wave vector modulator phase shifter topologies. In a study, an example VMPS was observed to achieve a 1.5 dB peak average gain with a 3-dB bandwidth from 110-145 GHz. The peak RMS amplitude and phase error are 1.2 dB and 8.5°, respectively, and the circuit consumed 20.3 mW of average DC power from a 1.5 V supply. The exemplary D-Band vector modulator phase shifter can achieve the widest fractional bandwidth of any mm-Wave vector modulator phase shifter implemented in silicon, GaN, GaAs, InP, SiGe, CMOS, and other RF material.

The VMPS may be employed for 6G cellular communications (>100 GHZ), next-generation Wi-Fi, or Internet of Things (IoT) applications, and provide very wide bandwidth at moderate gain and low power consumption.

In an aspect, a 5G or mm-wave communication module is disclosed comprising: a plurality of channels, each channel comprising a D-band phase shifter comprising; a plurality of differential delay lines coupled at a plurality of delay line junctions, wherein the plurality of differential delay lines are configured to provide a plurality of quadrature-phase shifts; a plurality of amplifiers coupled to the plurality of delay line junctions; and a buffer amplifier coupled to the plurality of amplifiers through a buffer coupling, wherein the buffer amplifier is configured to output a phase shifted signal for a channel of the plurality of channels.

In some embodiments, the plurality of differential delay lines comprises a first delay line, a second delay line coupled to the first delay line at a first coupling; a third delay line coupled to the second delay line at a second coupling; a fourth delay line coupled to the third delay line at a third coupling, wherein each of the first delay line, second delay line, and third delay line are configured to generate differential quadrature phases relative to each other.

In some embodiments, each of the first delay line, the second delay line, the third delay line, and the fourth delay line, comprise respective resistances, and wherein the resistances of the first delay line, the second delay line, the third delay line, and the fourth delay line, are configured with a ratio of 1:1.5:3.

In some embodiments, the plurality of amplifiers comprise a first pair of amplifiers and a second pair of amplifiers, wherein the first pair of amplifiers is coupled to the first coupling and second coupling, and wherein the second pair of amplifiers is coupled to the third coupling and the third delay line.

In some embodiments, the buffer coupling comprises a plurality of output delay lines joining each of the plurality of amplifiers to at least one other amplifier of the plurality of amplifiers wherein the plurality of amplifiers are configured to apply a plurality of weights to the signals at each of the plurality of delay line junctions.

In some embodiments, the buffer coupling comprises a zero-degree Combiner configured to combine signals from the plurality of amplifiers without a phase shift.

In some embodiments, the plurality of amplifiers comprise a plurality of variable gain amplifiers (VGA's), whereby the phase of the phase-shifted signal is controlled by the VGA's.

In some embodiments, each of the plurality of variable gain amplifiers is configured for separate voltage control, wherein the 5G or mm-wave communication module is configured to output a beamed signal by adjusting the gain of the plurality of variable gain amplifiers of each phase shifter of each D-band phase shifter of the plurality of channels.

In some embodiments, the buffer amplifier comprises a cascode amplifier.

In another aspect, a D-band phase shifter circuit is disclosed for a 5G or mm-wave communication module comprising: a first delay line; a second delay line coupled to the first delay line at a first coupling; a third delay line coupled to the second delay line at a second coupling; and a fourth delay line coupled to the third delay line at a third coupling, wherein the first delay line, the second delay line, the third delay line, and the fourth delay line, are configured to provide a plurality of quadrature-phase shifts.

In some embodiments, each of the first delay line, the second delay line, the third delay line, and the fourth delay line comprise respective resistances, and wherein the resistances of the second delay line, the third delay line, and the fourth delay line, are configured with a ratio of 1:1.5:3.

In some embodiments, each of the quadrature-phase shifts is 90° phase.

In some embodiments, each of the quadrature-phase shifts is 120° phase.

In another aspect, a D-band transceiver is disclosed, the transceiver comprising: a phased antenna array operably coupled to an output of a buffer amplifier of a phase shifter; a transmitter operably coupled to an input delay line of the phase shifter, wherein the phase shifter comprises: a plurality of differential delay lines coupled at a plurality of delay line junctions, wherein the plurality of differential delay lines are configured to provide a plurality of quadrature-phase shifts; a plurality of amplifiers coupled to the plurality of delay line junctions; and a buffer amplifier coupled to the plurality of amplifiers through a buffer coupling.

In some embodiments, the plurality of differential delay lines comprise a first delay line; a second delay line coupled to the first delay line at a first coupling; a third delay line coupled to the second delay line at a second coupling; and a fourth delay line coupled to the third delay line at a third coupling.

In some embodiments, each of the first delay line, the second delay line, the third delay line, and the fourth delay line comprise respective resistances, and wherein the resistances of the second delay line, third delay line, and the fourth delay line with a ratio of 1:1.5:3.

In some embodiments, each of the quadrature-phase shifts is 90° phase, and one of the plurality of amplifiers is inverting.

In some embodiments, each of the quadrature-phase shifts is 90° phase.

In some embodiments, each of the quadrature-phase shifts is 120° phase.

In some embodiments, each of the second delay line, the third delay line, and the fourth delay line comprises a trace with a meandering configuration.

BRIEF DESCRIPTION OF THE DRAWINGS

The skilled person in the art will understand that the drawings described below are for illustration purposes only.

FIG. 4A shows EM-simulated insertion losses of each differential quadrature delay line output according to an illustrative embodiment of the present disclosure. FIG. 4A shows EM-simulated average insertion loss and input matching of the differential quadrature delay lines according to an illustrative embodiment of the present disclosure. FIG. 4C shows EM-simulated relative phase shifts of each differential quadrature delay line output, according to an illustrative embodiment of the present disclosure. FIG. 4D shows EM-simulated RMS amplitude and phase errors of the differential quadrature delay lines, according to an illustrative embodiment of the present disclosure.

FIG. 6 illustrates a performance summary of an illustrative embodiment of the present disclosure and comparison with alternative mm-Wave vector modulator phase shifters.

DETAILED SPECIFICATION

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the list. For example, [1] refers to the first reference in the list. All references cited and discussed in this specification are incorporated herein by reference in their entireties and to the same extent as if each reference was individually incorporated by reference.

Example Phased-Array System

Figure 1:
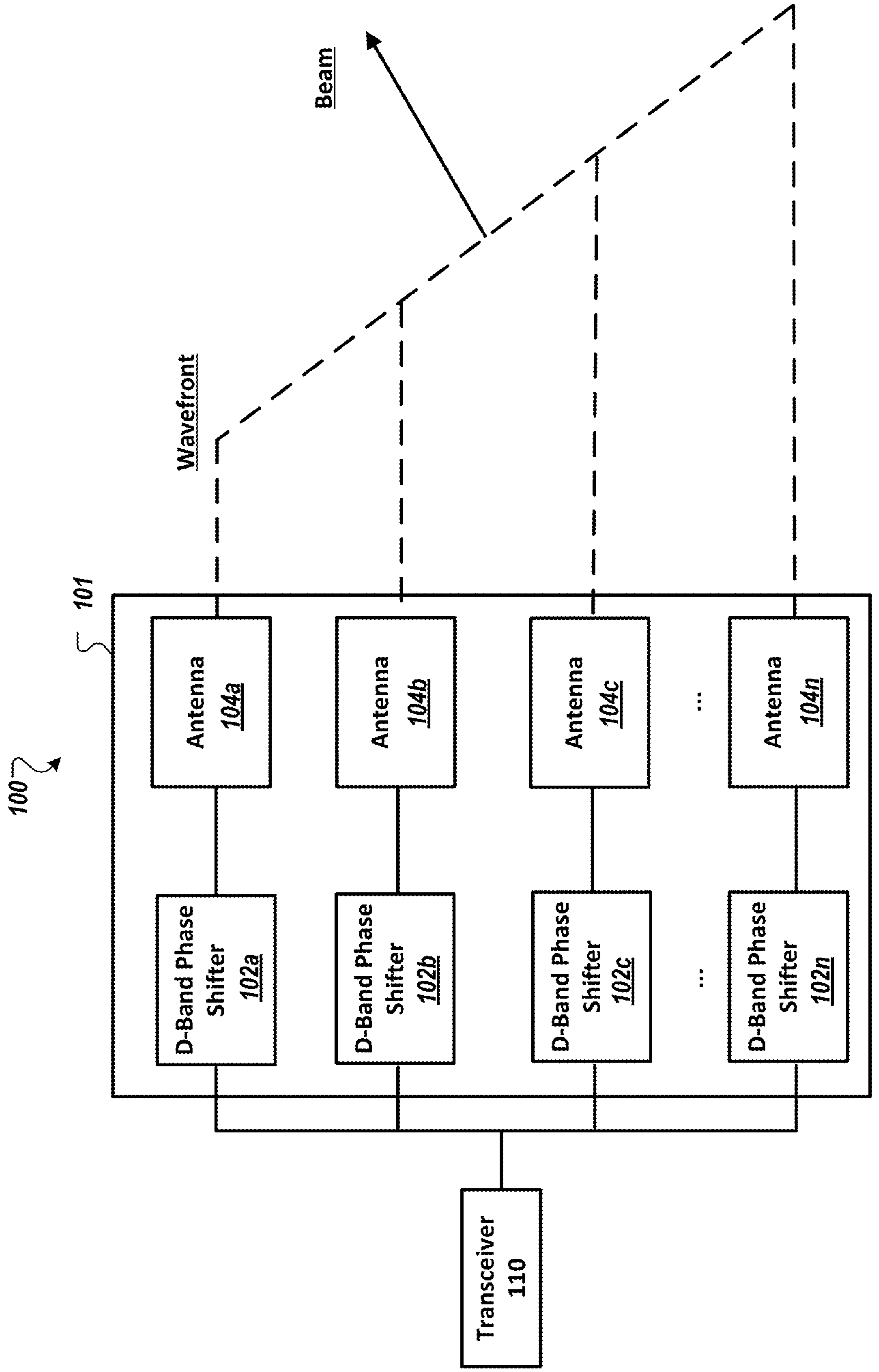
FIG. 1 shows an embodiment of a communication module configured for a 5G or mm-wave application, among others described herein, having a D-Band phase shifter coupled to a phased array antenna element, according to an illustrative embodiment of the present disclosure.

FIG. 1 shows an embodiment of a communication module 100 configured for a 5G or mm-wave application, among others described herein, having D-Band Phase Shifter 102 (shown as 102*a*, 102*b*, 102*c*, . . . , 102*n*) coupled to a phased array antenna element 104 (shown as "Antenna" 104*a*, 104*b*, 104*c*, . . . 104*n*). Each of the channels includes a D-Band Phase Shifter 102*a*, 102*b*, 102*c*, . . . , 120*n* that are coupled to a transceiver 106 to generate a phase-shifted signal of the input signals so that each of the channels is out of phase from each of the other channels for beam forming where the signals from each of the adjacent channels interfere constructively and destructively with one another along a wavefront. The resulting beam can be steered by adjusting the phases of each of the channels to create constructive interference in the direction of a beam. Any number of antennas 104 and the corresponding channel of D-band phase shifters 102 can be included in the antenna array 101.

D-band is a range of radio frequencies from 110 GHz to 170 GHz in the electromagnetic spectrum corresponding to the frequency band of operation of the WR6 and WR7 waveguides for mm-wave and 5G communication. These frequencies are equivalent to wavelengths between 2.7 mm and 1.8 mm.

Example D-Band Phase Shifter

Figure 2A:
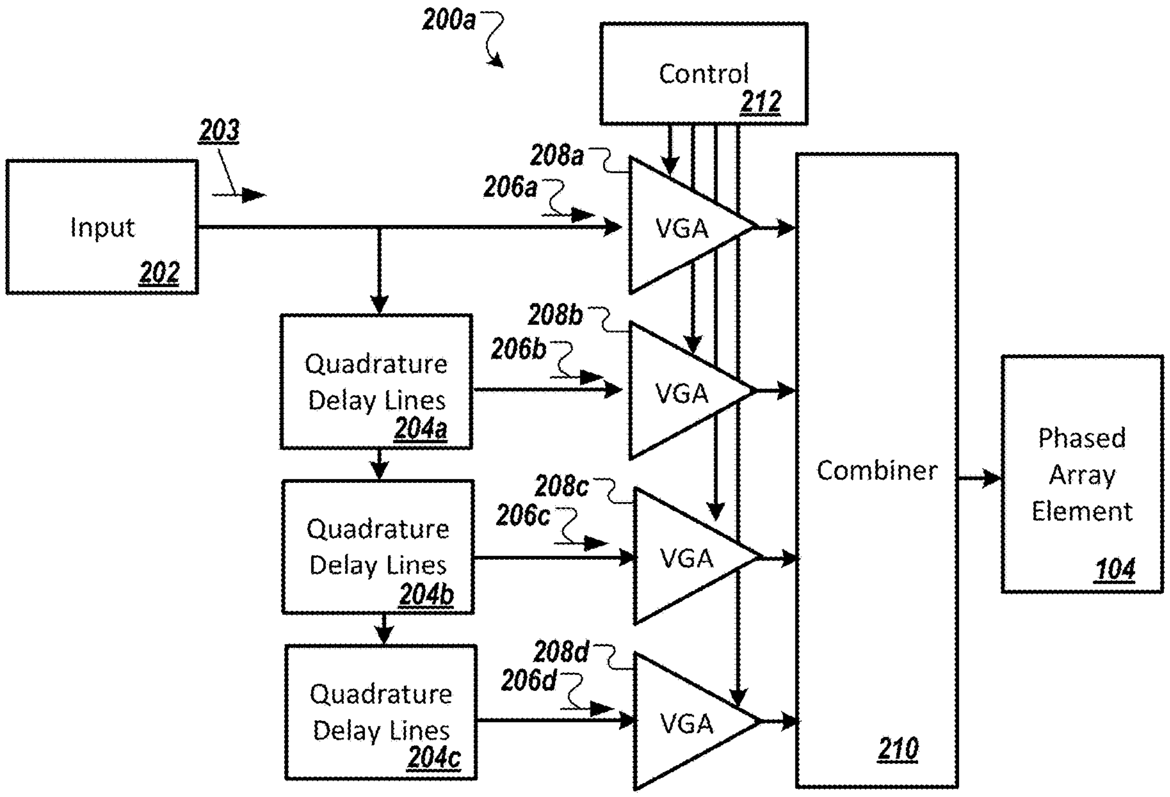
FIGS. 2A-2C each shows an example D-band phase shifter in accordance with an illustrative embodiment.
Figure 2B:
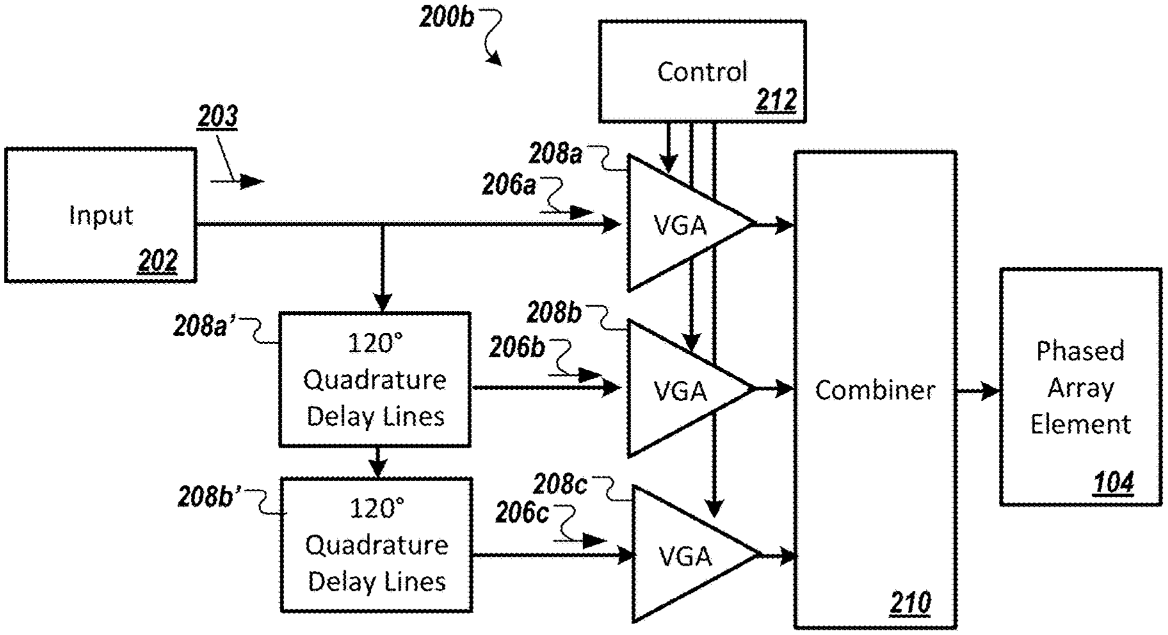
Figure 2C:
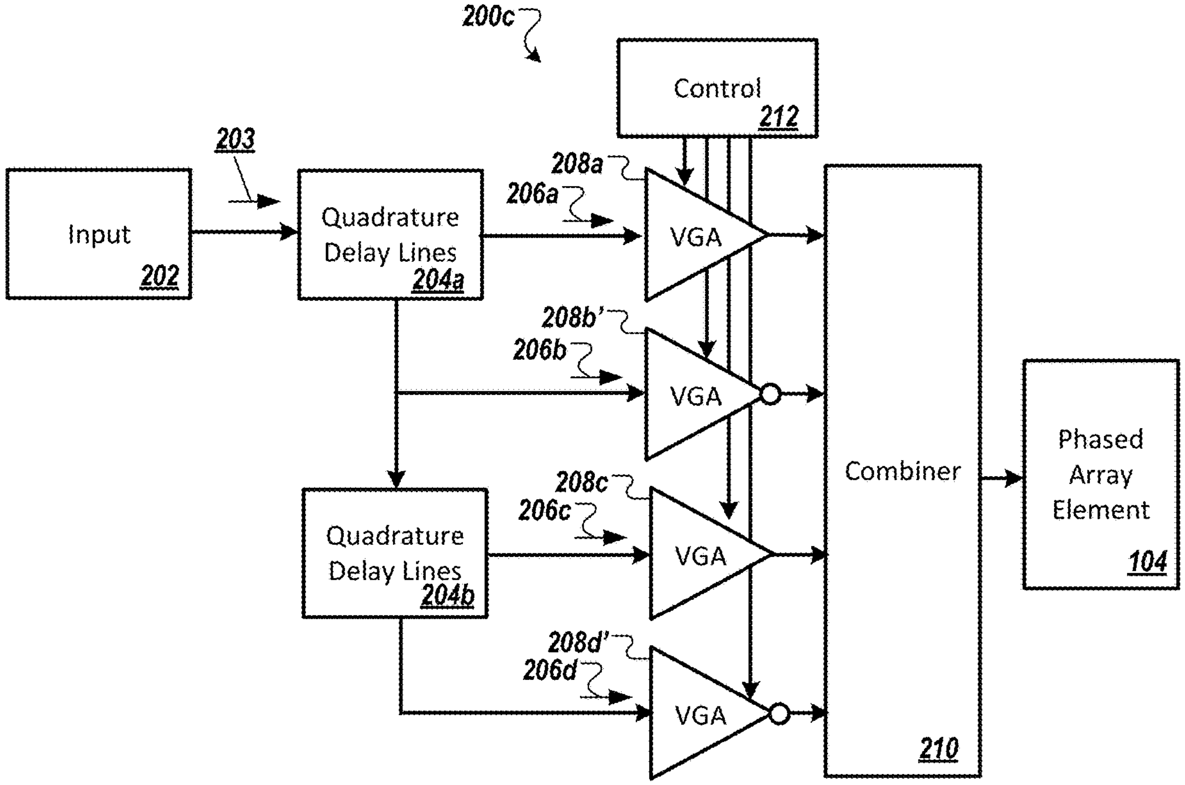

FIGS. 2A-2C each shows an example D-band phase shifter 102 (shown as 200*a*, 200*b*, 200*c*) in accordance with an illustrative embodiment. In each of FIGS. 2A, 2B, and 2C, the D-band phase shifter 200 includes input port 202 for input signal 203. The input port 202 feeds into quadrature delay lines 204 that are connected in series to one another to provide quadrature signals 206 of the input 203 to a variable gain amplifier 208. The output of each of the variable gain amplifiers 208 is combined via a combiner 210 to provide a signal (to the phased array element 104) that can create constructive interference in the direction of a beam. As used herein, a "delay line" refers to a component that causes a time delay in a signal.

FIG. 2A shows a 4-channel example comprising three quadrature delay lines 204 (shown as 204*a*, 204*b*, 204*c*) and four variable gain amplifiers 208 (shown as 208*a*, 208*b*, 208*c*, and 208*d*). Each quadrature delay line 204 is configured to introduce a phase delay in the signal that is 90° offset with respect to the input signal 203. A fourth delay can be implemented in an alternative embodiment.

FIG. 2B shows a 3-channel example comprising three 120°-quadrature delay lines 204 (shown as 204*a*', 204*b*', and 204*c*') and three variable gain amplifiers 208 (shown as 208*a*, 208*b*, and 208*c*). Each 120° quadrature delay line 204 is configured to introduce a phase delay in the signal that is 120° offset with respect to the input signal 203.

FIG. 2C shows a 4-channel example comprising two quadrature delay lines 204 (shown as 204*a*, 204*b*) and four variable gain amplifiers 208 (shown as 208*a*, 208*b*', 208*c*, 208*d*'). Two of the variable gain amplifiers 208*b*' and 208*d*' have configurations for inverted outputs or inverted inputs. The two quadrature delay lines 204*a*, 204*b* are configured to introduce a phase delay in the input signal 203 that is 90° offset with respect to the input signal 203. The two-phased delay signals are then amplified at 0° and 180° to provide two sets of corresponding+/−signals to be combined at the combiner 210.

Example Circuit Model

Figure 3A:
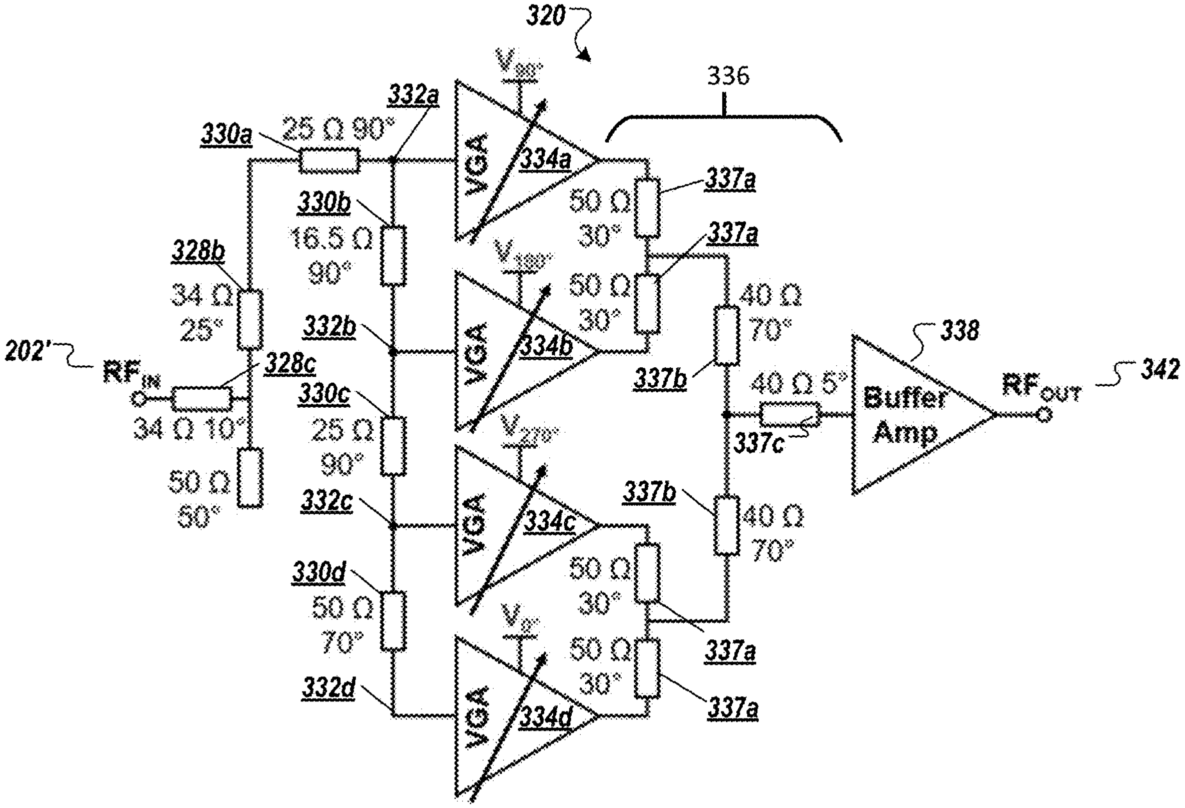
FIGS. 3A and 3B shows the circuit design employed in the study.

FIG. 3A shows a circuit model 300 of an example D-Band phase shifter 102 having quadrature, differential delay lines 204 (shown as 330*a*, 330*b*, 330*c*, 330*d*). The differential delay lines 330*a*, 330*b*, 330*c*, 330*d* can be configured to provide quadrature phase shifts in a signal that is input at the input 202 (shown as "$RF_{IN}$" 202') to the D-Band phase shifter 330. The differential delay lines 330*a*, 330*b*, 330*c*. 330*d* are sized so that the resistances of the first delay line, second delay line, and third delay line are, in a non-limiting example, in a ratio of 1:1.5:3. In the example shown in FIG. 1B, the resistances are shown as 16.5 ohms, 25 ohms, and 50 ohms, but it should be understood that other resistances and ratios can be used in other embodiments of the present disclosure.

In the example shown in FIG. 3A, the D-Band phase shifter 102 includes buffer coupling 336, as a combiner (e.g., 210), configured as a zero-degree Combiner, e.g., that can combine signals without a phase shift.

The differential delay lines 330*a*, 330*b*, 330*c*, and 330*d* are joined between delay line junctions 332*a*, 332*b* (also referred herein to as "couplings" between the delay lines) to generate differential quadrature phases relative to one another. In FIG. 3A, the first differential delay line 330*a* has a resistance of 25 ohms to provide a phase offset of 90 degrees, and the second differential delay line 330*b* has a resistance of 16.5 ohms to provide a phase offset of 90 degrees from the first differential delay line 330*a*, the third differential delay line 330*c* has a resistance of 25 ohms to provide a phase offset of 90 degrees from the second differential delay line 330*b*, and the fourth differential delay line 330*d* has a resistance of 50 ohms to provide a phase of set of 70 degrees from the third differential delay line 330*c*. While FIG. 3A shows four differential delay lines 330*a*, 330*b*, 330*c*. 330*d*, it is contemplated that multiple input delay lines can be coupled between the RF input 202' and the first delay line 330*a*.

Amplifiers 334*a*, 334*b*, 334*c*, 334*d* are coupled to the delay line junctions 332*a*, 332*b*, 332*c*, 332*d*. The differential delay lines 330*a*, 330*b*, 330*c*, 330*d* can shift the signal between each delay line junction 332*a*, 332*b*, 332*c*, 332*d* so that the amplifiers 334*a*, 334*b*, 334*c*, 334*d* amplify phase-shifted signals between the junctions. The amplifiers can be configured to apply weights to the signals at each of the plurality of delay line junctions.

Figure 3B:
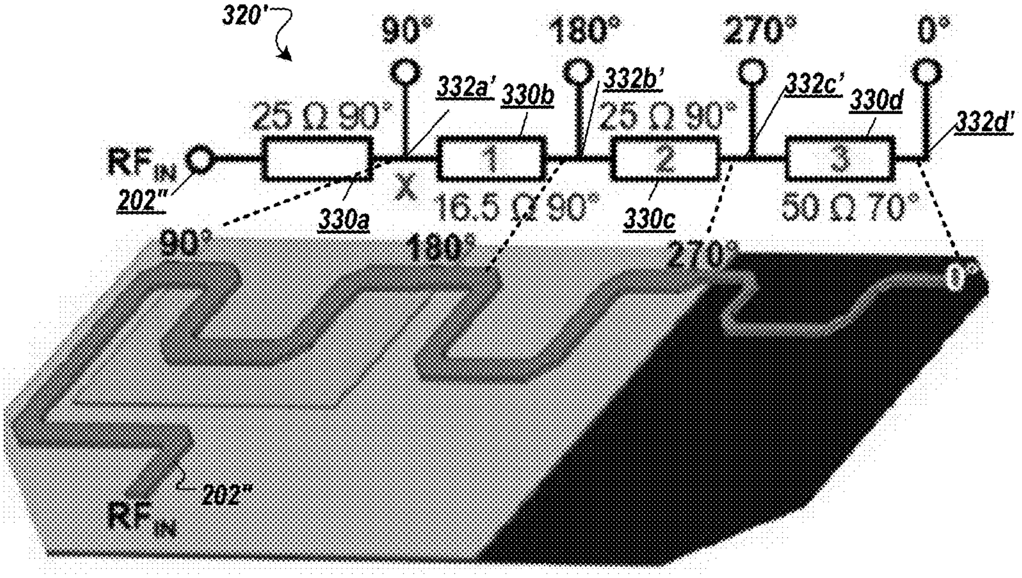

In some embodiments, the amplifiers 334*a*, 334*b*, 334*c*, 334*d* are arranged so that amplifiers 334*a* and 334*b* form a first pair and amplifiers 334*c* and 334*d* form a second pair, as shown in FIG. 3B. The amplifiers 334*a*, 334*b* in the first pair are coupled, respectively, to the first delay line junction 332*a* and second delay line junction 332*b*. The amplifiers 134*c*, 134*d* in the second pair are coupled, respectively, to the third delay line junction 132*c* and fourth delay line junction 132*d*. It should be understood that in embodiments with additional amplifiers, delay lines, and couplings additional pairs of amplifiers could be used and that the two pairs of amplifiers shown in FIG. 1B is intended only as a non-limiting example.

In some embodiments, the amplifiers 334*a*, 334*b*, 334*c*, 334*d* can be variable gain amplifiers (VGA's). The amplifiers can be configured as programmable gain amplifiers. The variable gain of the variable gain amplifiers can used to set the weights to the signals at the delay line junctions 332*a*, 332*b*, 332*c*, 332*d*, e.g., by adjusting the variable gain of each of the amplifiers 334*a*, 334*b*, 334*c*, 334*d* to shift the phase of the output signal, e.g., via separate voltage control, e.g., from controller 212. When the D-band phase shifter 334 is used in a 5G or mm-wave communication module (e.g., the communication module 100 shown in FIG. 1), the voltage control of the amplifiers 334*a*, 334*b*, 334*c*, 334*d* can be used to configure a beamed signal by adjusting the gain of the plurality of variable gain amplifiers using the voltage control.

The amplifiers 334*a*, 334*b*, 334*c*, and 334*d* can be coupled to a buffer amplifier 338 (e.g., cascode amplifier) through a buffer coupling 336. In some embodiments of the present disclosure, the buffer coupling 336, as a combiner (e.g., 210), can include a set of output delay lines 337*a*, 337*b*, 337*c*.

It should be understood that embodiments of the present disclosure include more than three differential delay lines that can be joined to form more than two delay line junctions. As a non-limiting example, in an embodiment, the circuit includes a fifth differential delay line that joins to the fourth differential delay line at a fourth delay line junction. In some embodiments, the circuit includes two or three differential delay lines.

Example Quadrature Delay Line

FIG. 3B shows a physical implementation of the quadrature delay lines 330*a*, 330*b*, 330*c*, 330*d* (shown as 330*a*', 330*b*', 330*c*', 330*d*') for the D-band phase shifter circuit 320 (shown as 320'). Arrangement of the lengths of the quadrature delay lines 330*a*', 330*b*', 330*c*', and 330*d*' in a meandering or serpentine pattern can reduce the size of the quadrature delay lines 330*a*', 330*b*', 330*c*', 330*d*', e.g., to fit with the size of a given phased array element. Other meandering or serpentine arrangements may be employed.

In the example shown in FIG. 3B, the quadrature delay lines 330*a*', 330*b*', 330*c*', 330*d*' is coupled to an input 202 (shown as 202"). The input is coupled to a first delay line 330*a*. The second delay line 330*b* is coupled to the first delay line 330*a* at a coupling 332*a*'. The third delay line 330*c* is coupled to the second delay line 330*b* at a coupling 332*b*'. The fourth delay line 330*d* is coupled to the third delay line 330*c* at a coupling 332*c*'.

The first delay line 330*a* is configured for a phase shift of 90 degrees. The second delay line 330*b* is configured for a phase shift of 90 degrees. The third delay line 330*c* is configured for a phase shift of 90 degrees. The fourth delay line 330*d* is configured for a phase shift of 70 degrees.

In addition, the delay lines can provide wideband operation as compared to standard lumped, distributed element couplers and baluns in behaving like tapered impedance transformers, resulting in high-quality matching over a wide bandwidth at the expense of insertion loss. The differential quadrature generation of the VMPS can be realized with the tapered delay lines. In FIG. 3A, four 90° delay lines are utilized to generate differential quadrature phases, and the impedances can be selected to ensure equal amplitudes at each of the outputs and high-quality input matching, assuming each of the outputs is terminated with 50Ω. The input signal can be divided with current division at each node possessing a T-junction, beginning from node "x."

To ensure the equal amplitude of each output, the characteristic impedances of each of the successive lines from node X onwards can be calculated via Equation 1.

$$Z_{0,n} = \frac{Z_l}{N - n + 1} \quad \text{(Eq. 1)}$$

In Equation 1, N is the total number of sections proceeding node "x," which is 3 in this case, n is the current T-line section, where n is 1 at node X and increases moving right, $Z_1$ is the load impedance at each output, which is 50Ω, and $Z_{0,n}$ is the characteristic impedance of the nth transmission line. The ideal loss at each delay line output is 6 dB. Indeed, other structures may be employed in which N can 2, 3, 4, 5, 6, 7, 8. In some embodiments, N can be greater than 8.

The 25Ω transmission line 330*a*' at the input 202" can serve at least two purposes: 1) to provide 90° of phase shift for the first output, and 2) to serve as a λ/4 transformer to transform the 12.5Ω impedance looking into node X (332*a*') to 50Ω at the input. Each of the transmission lines provides a 90° phase shift to provide a 90°-signal, 180°-signal, and 270°-signal the amplifier. The 50Ω t-line (330*d*) provides a 90° phase shift to provide the 0°-signal because the higher impedance demanded a narrow width of 7 μm, which is lossier compared to the wide 16-18 μm widths of the other delay lines. Tapering and changing the ground plane may be used in conjunction to achieve the wide range of impedances of the delay lines.

Experimental Results and Examples

A study was conducted to develop and evaluate a 110-145 GHz SiGe HBT (heterojunction bipolar transistor) D-Band Vector modulator Phase shifter (VMPS) with 4-bit control. The phase shifter used in the study included a transmission line-based delay line topology to generate differential quadrature signals that are weighted by 4 VGAs and cascaded with a buffer amplifier. The VMPS achieved a 1.5 dB peak average gain with a 3-dB bandwidth from 110-145 GHz. The peak RMS amplitude and phase errors were 1.2 dB and 8.5°, respectively, and the circuit consumed 20.3 mW of average DC power from a 1.5 V supply. The D-Band vector modulator phase shifter achieved an advantageously wide fractional bandwidth compared to existing mm-Wave vector modulator phase shifters implemented in silicon.

FIGS. 3A and 3B shows the circuit design employed in the study.

Figure 4A:
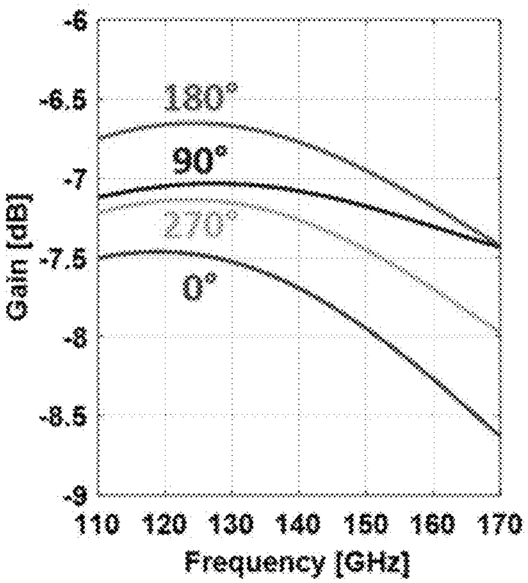
FIGS. 4A-4D show the EM-simulated performance of the delay lines.
Figure 4B:
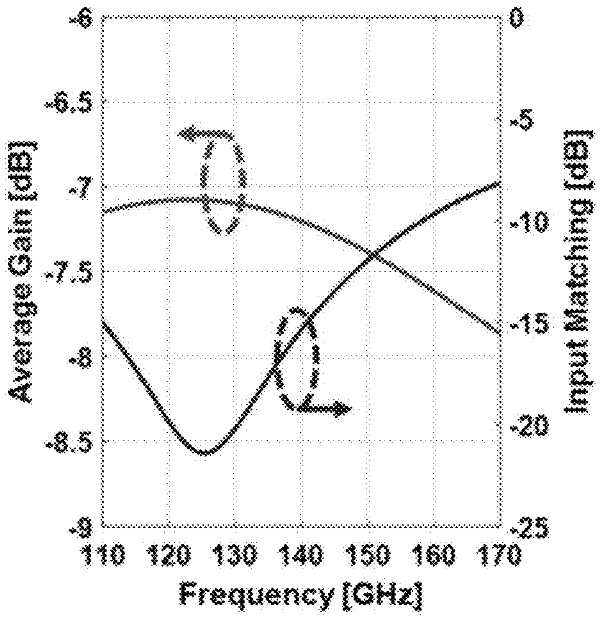
Figure 4C:
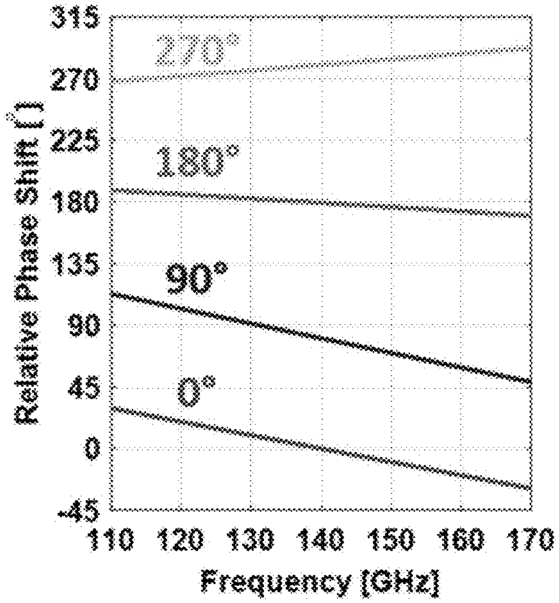
Figure 4D:
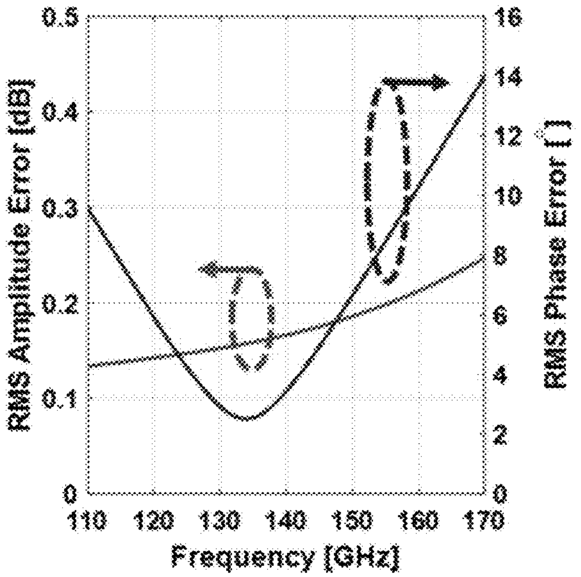

FIGS. 4A-4D show the EM-simulated performance of the delay lines. FIG. 4A shows the insertion losses of each of the outputs have no more than 2.6 dB of insertion loss (IL) for all of D-Band, and FIG. 4B shows a peak average IL of 1.1 dB with <1.9 dB average IL and >8.2 dB input return loss across D-Band. FIG. 4C shows that each of the 4 relative phase shifts maintains a wideband response with <0.25 dB and <14° RMS amplitude and phase errors, respectively, over the entirety of D-Band.

Figure 5A:
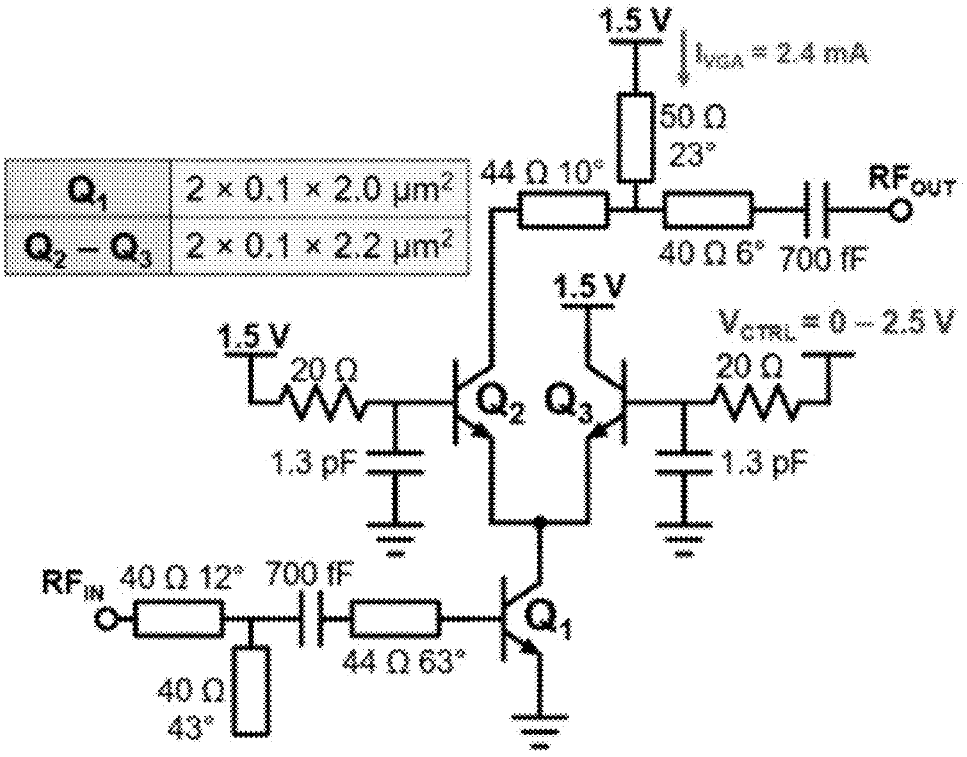
FIG. 5A shows the schematics of a current-stealing VGA structure, e.g . . . , used in the example D-band phase shifter in accordance with an illustrative embodiment.

FIG. 5A shows the schematics of a current-stealing VGA structure employed to provide a large gain tuning range and a constant bias current at the VGA input, such that the differential quadrature generation remains unchanged across all VGA states. In the example, the transistors were sized to maximize gain for a low power consumption of 3.6 mW. The input matching network was designed to match to 50Ω, and the output matching network was designed to maximize gain, presenting a high output impedance of 125+j60Ω looking into the output node, RFOUT. Low-pass RC networks were used at the cascode bases for stability. The VGA gain was controlled with VCTRL at the Q3 base, which can be varied from 0 to 2.5 V.

The EM-simulated performance of the VGA can provide 6.5 dB of peak gain at 125 GHz for the highest gain state with a 3-dB bandwidth from 110-143 GHZ. The gain of the VGA can be varied from +6.5 dB to −30 dB by varying VCTRL from 0 to 2.5 V.

Figure 5B:
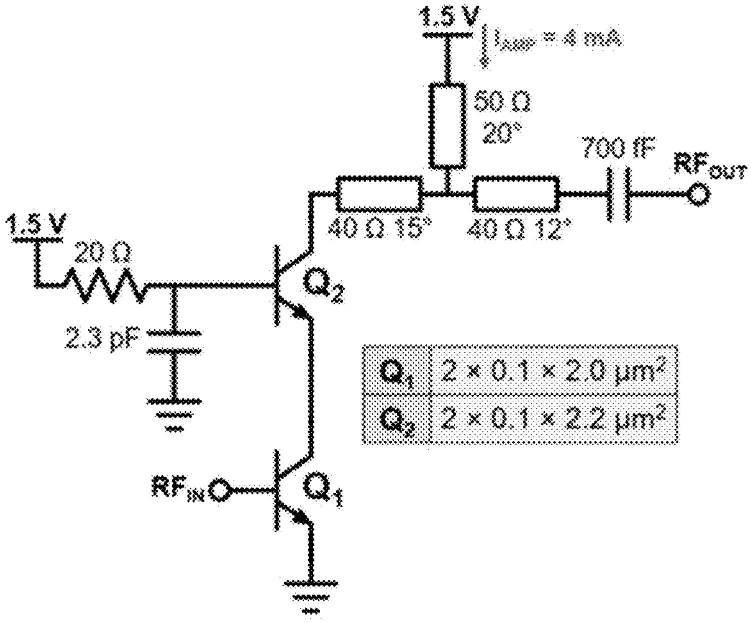
FIG. 5B shows a schematic of an example buffer, e.g., used in the example D-band phase shifter, in accordance with an illustrative embodiment.

FIG. 5B shows a schematic of an example buffer (e.g., buffer amplifier 338). All electrical lengths were calculated at 125 GHZ. The buffer amplifier shown in FIG. 5B was realized as a cascode amplifier in order to maximize gain. The transistors were sized to maximize gain for a low power consumption of 6 mW. The output matching network is designed to match to 500. Low-pass RC networks are included at the cascode base for stability. The EM-simulated performance of the buffer provides 9 dB of peak gain at 133 GHz with a 3-dB bandwidth from 112-155 GHz.

FIG. 3A shows the complete schematic of the VMPS employed in the study. All transistor cores and passives were EM-simulated with Cadence EMX. The additional input matching network preceding the differential quadrature delay lines was utilized to match the 60Ω seen looking into the differential quadrature input to 5002 at the circuit input. All 4 of the utilized VGAs are identical and the same as shown in FIG. 5A. Each of the VGAs had a separate control voltage that was utilized to weigh the differential quadrature signals in order to achieve a given phase shift. The outputs of the VGAs were combined with a zero-degree Combiner and fed to the input of the buffer amplifier. For the zero-degree Combiner, the impedances, and electrical lengths were selected to minimize insertion loss and ensure interstage matching between the VGAs and the buffer amplifier. The 5002, 30° T-junction splitter lines coming from the VGAs were selected to transform the high output impedance of the VGAs from 125+j60Ω to 40-j35Ω. The 400, 70° T-junction splitter lines were selected to transform the first splitters' output impedance of 40-j35Ω to 10+j10Ω, which is conjugate matched with the low input impedance looking into the buffer amplifier. The 400, 5° line going from the second splitter to the buffer amplifier was included as routing from the output of the splitter to the amplifier input.

Figure 7:
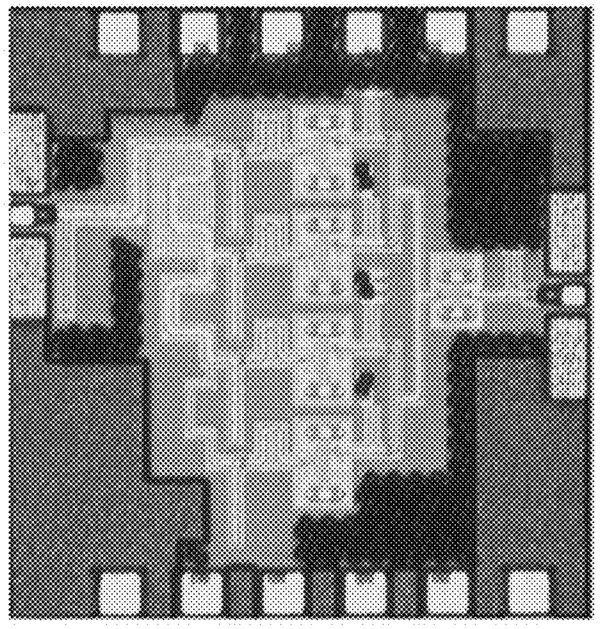
FIG. 7 shows a die micrograph of a fabricated VMPS according to an illustrative embodiment of the present disclosure.

Simulation and Measurement Results. The VMPS was fabricated in 90 nm SiGe 90HPSIGE+BiCMOS technology. FIG. 7 shows a micrograph of the fabricated VMPS.

Figure 8A:
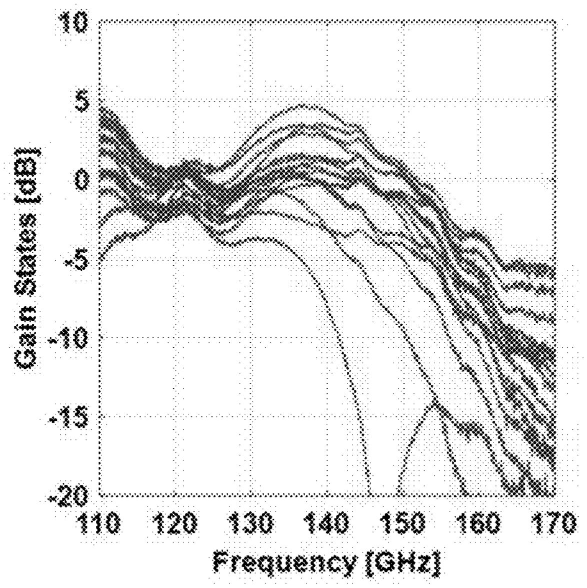
FIG. 8A shows frequency vs. measured gain across all phase shift states, according to an illustrative embodiment of the present disclosure.
Figure 8B:
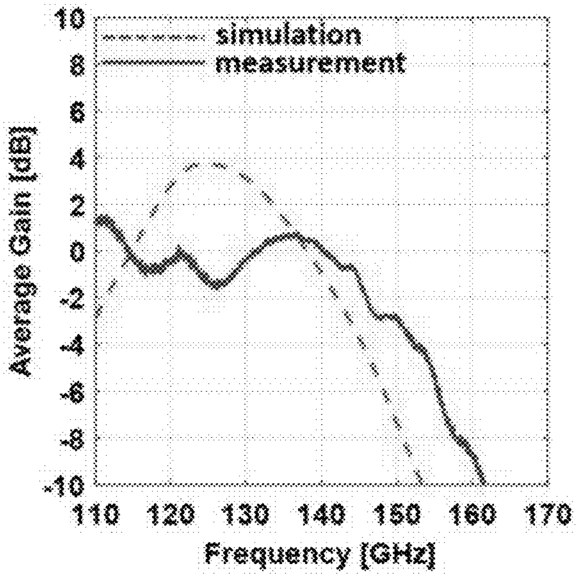
FIG. 8B shows frequency vs measured and simulated average gain, according to an illustrative embodiment of the present disclosure.

FIGS. 8A and 8B show the measured and simulated gain across all VMPS states. FIG. 8A demonstrates that the measured gain varies from −5 to +4.5 dB across roughly all states from 110-145 GHz. FIG. 8B shows the peak measured average gain of 1.5 dB at 111 GHz with a 3-dB bandwidth from 110-145 GHz. The peak measured average gain of 1.5 dB is 2.2 dB less than the peak simulated average gain of 3.7 dB, and the measured bandwidth is also increased due to increased ohmic losses in the buffer output that de-Q the output and were not represented in EM-simulation.

Figure 9A:
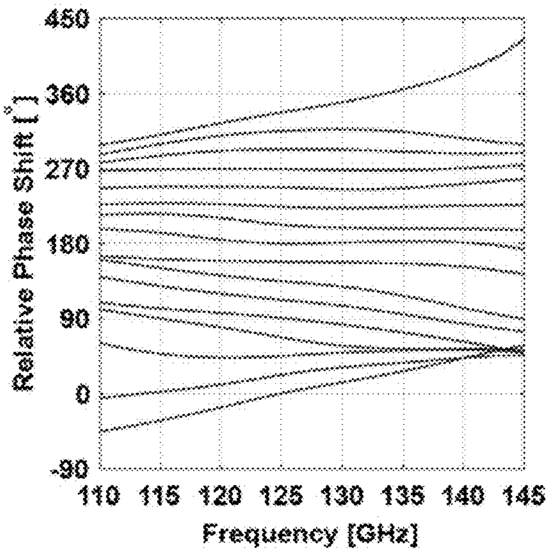
FIG. 9A shows frequency vs relative phase shift across all phase shift states, according to an illustrative embodiment of the present disclosure.
Figure 9B:
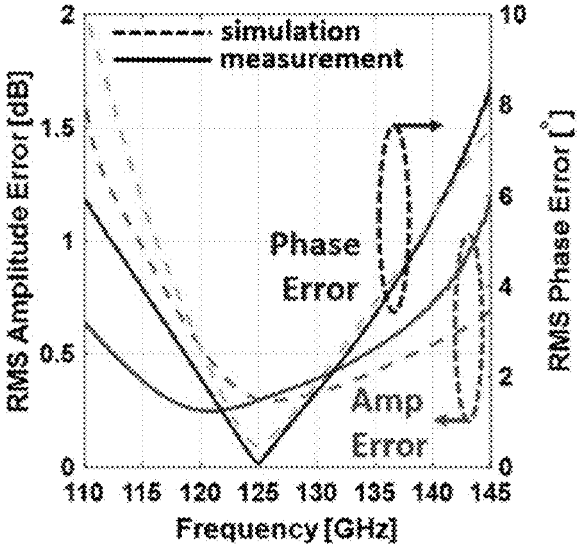
FIG. 9B shows frequency vs. measured and simulated RMS amplitude and phase errors, according to an illustrative embodiment of the present disclosure.

FIG. 9A shows the 16 measured relative phase shift states from 0 to 337.5° in 22.5° steps. The phase shifts states were achieved by varying the individual control voltages of each of the 4 VGAs to result in exact 22.5° relative phase shifts with respect to the reference 0°-state at 125 GHz. FIG. 9B shows that from 110-145 GHz, the measured RMS amplitude and phase errors are <1.2 dB and <8.5°, respectively, and they are in close agreement with simulations.

Figure 10A:
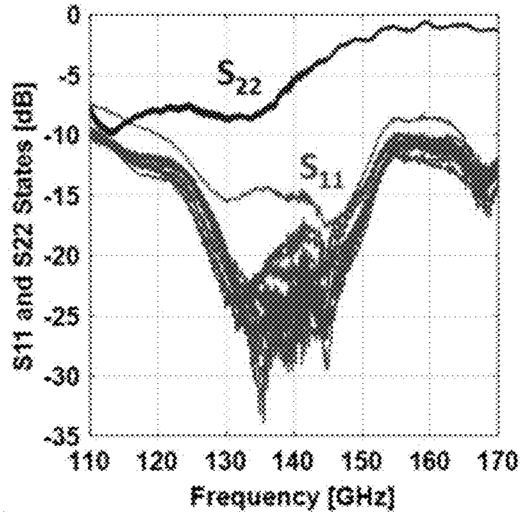
FIG. 10A shows frequency vs. measured S11 and S22 across all phase shift states, according to an illustrative embodiment of the present disclosure.
Figure 10B:
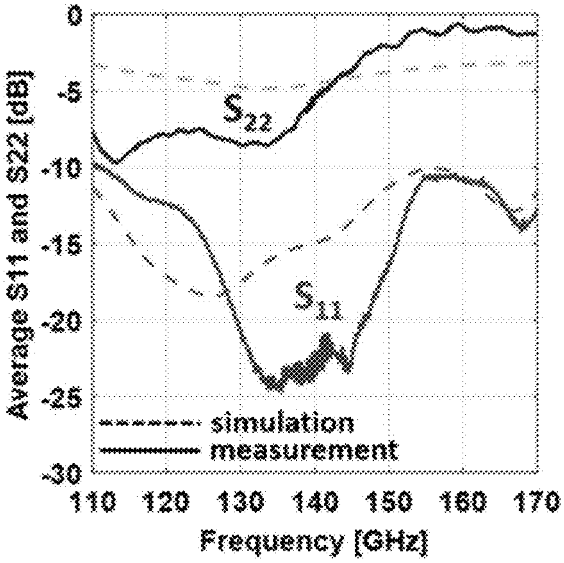
FIG. 10B shows frequency vs measured and simulated average S11 and S22, according to an illustrative embodiment of the present disclosure.

FIG. 10A shows that for all states from 110-145 GHZ, the measured $S_{11}$ and $S_{22}$ return losses remained>7.4 dB and >3.5 dB, respectively. FIG. 10B shows that the average measured $S_{11}$ was >10 dB from 110-170 GHz, and it is in close agreement with the simulation. The average measured $S_{22}$ was >3.5 dB from 110-145 GHZ, and $S_{22}$ was improved from the simulation at the low-band due to the de-Q'ing effect of the increased ohmic losses of the buffer output that were not captured in EM simulation.

Figure 11:
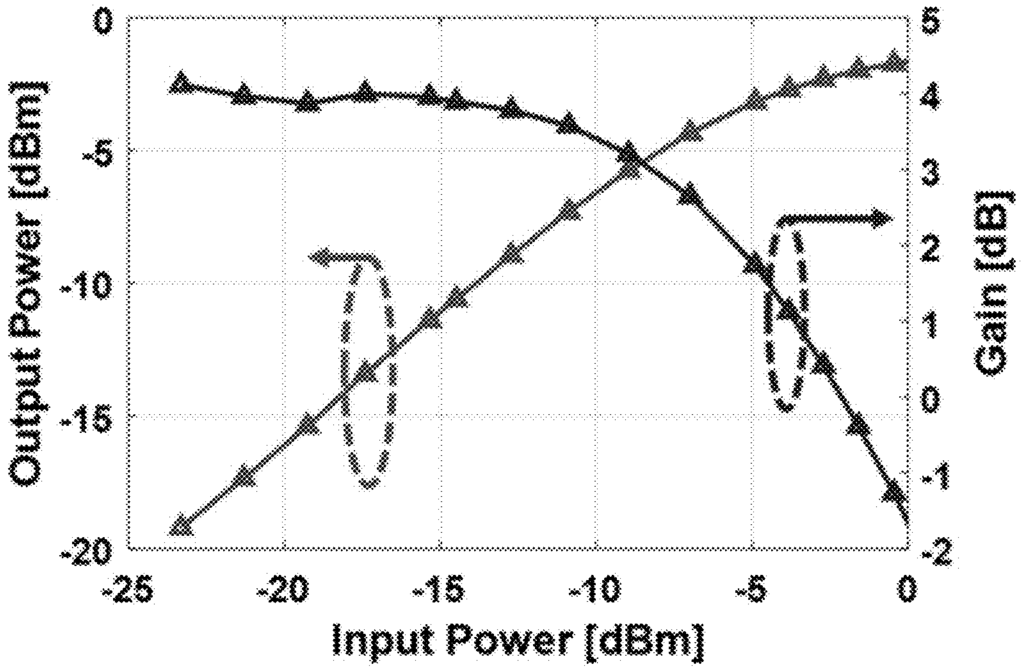
FIG. 11 illustrates input power vs. output power and gain IP1 dB sweep at the 45°-state with a max gain of 4.5 dB at 135 GHz, according to an illustrative embodiment of the present disclosure.

FIG. 11 shows the measured $P_{1\ dB}$ input power sweep of the VMPS for the 45°-state, which results in its max gain of 4.5 dB at 135 GHz. The measured IP1 dB of the VMPS was −9 dBm at 135 GHz. The VMPS had an average power consumption of 20.3 mW across all states with a $V_{CC}$ of 1.5 V supplying an average current of 13.5 mA to the VGAs and buffer amplifier. The VMPS was compared to existing work in FIG. 6. The instant VMPS achieved a higher 3-dB bandwidth of 35 GHz and significantly higher fractional bandwidth (27.5%) than any other mm-Wave VMPS in silicon while simultaneously achieving a moderate gain of 1.5 dB and low average power consumption of 20.3 mW.

DISCUSSION

High-performance, wideband mm-wave transceivers can be used at D-Band (110-170 GHz) due to the greater available bandwidth, which enables high data rate communications [1]. One major drawback of using mm-wave frequencies for wireless communications is the greater path loss resulting from atmospheric attenuation. This can require that phased arrays be utilized to achieve acceptable effective isotropic radiated power (EIRP) and beam steering over long distances [2]. Phased arrays require phase shifters for each antenna element to achieve beam steering and low power consumption and small die area are desired to prevent the phased array from becoming too large and power-hungry. For a wideband mm-wave transceiver, it can also be desirable that each phase shifter achieve wide bandwidth and moderate-to-high gain. One topology that is useful for achieving moderate to high gain, wide bandwidth, and low power consumption is a vector modulator phase shifter (VMPS), which typically utilizes couplers to generate quadrature signals that are weighted by variable gain amplifiers (VGA) and combined to achieve up to 360° of phase shift, with high resolution.

Previous mm-Wave VMPS at or near D-Band includes drawbacks. The D-Band VMPS demonstrated in [3] utilizes a distributed element 90° and 180° hybrid couplers, switches, and loss compensation amplifiers to realize quadrature combining VGA weighted I and Q signals. The VMPS in [3] achieves high gain but suffers from high power consumption and narrow bandwidth that is limited by the couplers. The D-Band VMPS in [4] utilizes triple cascode VGAs in a Gilbert-cell topology to achieve wide bandwidth and very low power consumption, but a drawback is that the design features high insertion loss. The mm-Wave VMPS in [5] utilizes a novel lumped element-based active coupler to generate I and Q signals to achieve moderate gain, moderate bandwidth, and low power consumption. It is difficult to achieve simultaneous wide bandwidth and low loss with lumped element couplers at D-Band, where inductor and capacitor self-resonances make their design challenging.

The 4-bit D-Band VMPS in the present work utilizes a transmission line-based delay line topology to generate differential quadrature signals that are weighted by 4 VGAs and cascaded with a buffer amplifier to achieve wide bandwidth, moderate gain, and low power consumption. The presented D-Band vector modulator phase shifter achieves a wider fractional bandwidth compared to the other mm-wave vector modulator phase shifters implemented in silicon described herein.

Although example embodiments of the present disclosure are explained in some instances in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "5 approximately" one particular value and/or to "about" or "approximately" another particular value. When such a range is expressed, other exemplary embodiments include from the one particular value and/or to the other particular value.

By "comprising" or "containing" or "including" is meant that at least the name compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance specific tissues or fluids of a subject (e.g., human tissue in a particular area of the body of a living subject), which may be in a particular location of the subject, referred to herein as an "area of interest" or a "region of interest."

It should be appreciated that as discussed herein, a subject may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to human (e.g. rat, dog, pig, monkey), etc. It should be appreciated that the subject may be any applicable human patient, for example.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5).

Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

The following patents, applications and publications as listed below and throughout this document are hereby incorporated by reference in their entirety herein.

[1] A. Karakuzulu, M. H. Eissa, D. Kissinger, and A. Malignaggi, "Full D-Band Transmit-Receive Module for Phased Array Systems in 130-nm SiGe BiCMOS," *IEEE Solid-State Circuits Letters*, vol. 4, pp. 40-43, 2021.

[2] D. d. Rio et al., "A D-Band 16-Element Phased-Array Transceiver in 55-nm BiCMOS," *IEEE Transactions on Microwave Theory and Techniques*, pp. 1-0, 2022.

[3] S. Afroz and K. J. Koh, "A D-Band Two-Element Phased-Array Receiver Front End With Quadrature-Hybrid-Based Vector Modulator," *IEEE Microwave and Wireless Components Letters*, vol. 28, no. 2, pp. 180-182, 2018.

[4] P. V. Testa, C. Carta, and F. Ellinger, "A 160-190-GHz VectorModulator Phase Shifter for Low-Power Applications," *IEEE Microwave and Wireless Components Letters*, vol. 30, no. 1, pp. 86-89, 2020.

[5] D. Pepe and D. Zito, "Two mm-Wave Vector Modulator Active Phase Shifters With Novel IQ Generator in 28 nm FDSOI CMOS," *IEEE Journal of Solid-State Circuits*, vol. 52, no. 2, pp. 344-356, 2017.

[6] S. Afroz and K. J. Koh, "W-Band (92-100 GHz) Phased-Array Receive Channel With Quadrature-Hybrid-Based Vector Modulator," *IEEE Transactions on Circuits and Systems I: Regular Papers*, vol. 65, no. 7, pp. 2070-2082, 2018. D. d. Rio, I. Gurutzeaga, R. Berenguer, I. Huhtinen, and J. F. Sevillano, "A Compact and High-Linearity 140-160 GHz Active Phase Shifter in 55" "nm BiCMOS," *IEEE Microwave and Wireless Components Letters*, vol. 31, no. 2, pp. 157-160, 2021.

What is claimed:

1. A 5G or mm-wave transmitter comprising:

a plurality of channels, each channel comprising a D-band phase shifter comprising;

a plurality of differential delay lines coupled at a plurality of delay line junctions, wherein the plurality of differential delay lines are configured to provide a plurality of quadrature-phase shifts, wherein the plurality of differential delay lines comprises a first delay line, a second delay line coupled to the first delay line at a first coupling; a third delay line coupled to the second delay line at a second coupling; a fourth delay line coupled to the third delay line at a third coupling, wherein each of the first delay line, second delay line, and third delay line are configured to generate differential quadrature phases relative to each other, and wherein each of the first delay line, the second delay line, the third delay line, and the fourth delay line, comprise respective resistances, and wherein the resistances of the first delay line, the second delay line, the third delay line, and the fourth delay line, are configured with a ratio of 1:1.5:3;

a plurality of amplifiers coupled to the plurality of delay line junctions; and a buffer amplifier coupled to the plurality of amplifiers through a buffer coupling, wherein the buffer amplifier is configured to output a phase shifted signal for a channel of the plurality of channels.

2. The 5G or mm-wave transmitter of claim 1, wherein the plurality of amplifiers comprise a first pair of amplifiers and a second pair of amplifiers, wherein the first pair of amplifiers is coupled to the first coupling and second coupling, and wherein the second pair of amplifiers is coupled to the third coupling and the third delay line.

3. The 5G or mm-wave transmitter of claim 1, wherein the buffer coupling comprises a plurality of output delay lines joining each of the plurality of amplifiers to at least one other amplifier of the plurality of amplifiers wherein the plurality of amplifiers are configured to apply a plurality of weights to the signals at each of the plurality of delay line junctions.

4. The 5G or mm-wave transmitter of claim 1, wherein the buffer coupling comprises a zero-degree combiner configured to combine signals from the plurality of amplifiers without a phase shift.

5. The 5G or mm-wave transmitter of claim 1, wherein the plurality of amplifiers comprise a plurality of variable gain amplifiers (VGA's), whereby the phase of the phase-shifted signal is controlled by the VGA's.

6. The 5G or mm-wave transmitter of claim 5, wherein each of the plurality of variable gain amplifiers is configured for separate voltage control, wherein the 5G or mm-wave transmitter is configured to output a beamed signal by adjusting the gain of the plurality of variable gain amplifiers of each phase shifter of each D-band phase shifter of the plurality of channels.

7. The 5G or mm-wave transmitter of claim 1, wherein the buffer amplifier comprises a cascode amplifier.

8. A D-band phase shifter circuit for a 5G or mm-wave communication module comprising:

a first delay line;

a second delay line coupled to the first delay line at a first coupling;

a third delay line coupled to the second delay line at a second coupling; and a fourth delay line coupled to the third delay line at a third coupling, wherein the first delay line, the second delay line, the third delay line, and the fourth delay line, are configured to provide a plurality of quadrature-phase shifts and wherein each of the first delay line, the second delay line, the third delay line, and the fourth delay line comprise respective resistances, and wherein the resistances of the second delay line, the third delay line, and the fourth delay line, are configured with a ratio of 1:1.5:3.

9. The phase shifter of claim 8, wherein each of the quadrature-phase shifts is 90° phase.

10. The phase shifter of claim 8, wherein each of the quadrature-phase shifts is 120° phase.

11. A D-band transmitter, the transmitter comprising:

a phased antenna array operably coupled to an output of a buffer amplifier of a phase shifter;

a transmitter operably coupled to an input delay line of the phase shifter, wherein the phase shifter comprises:

a plurality of differential delay lines coupled at a plurality of delay line junctions, wherein the plurality of differential delay lines are configured to provide a plurality of quadrature-phase shifts, wherein the plurality of differential delay lines comprise at least a first delay line, a second delay line, a third delay line, and a fourth delay line, and wherein each of the first delay line, the second delay line, the third delay line, and the fourth delay line comprise respective resistances, and wherein the resistances of the second delay line, third delay line, and the fourth delay line are configured with a ratio of 1:1.5:3;

a plurality of amplifiers coupled to the plurality of delay line junctions; and a buffer amplifier coupled to the plurality of amplifiers through a buffer coupling.

12. The D-Band transmitter of claim 11, wherein the plurality of differential delay lines comprise a first delay line; a second delay line coupled to the first delay line at a first coupling; a third delay line coupled to the second delay line at a second coupling; and a fourth delay line coupled to the third delay line at a third coupling.

13. The D-Band transmitter of claim 11, wherein each of the quadrature-phase shifts is 90° phase, and one of the plurality of amplifiers is an inverting amplifier.

14. The D-Band transmitter of claim 11, wherein each of the quadrature-phase shifts is 90° phase.

15. The D-Band transmitter of claim 11, wherein each of the quadrature-phase shifts is 120° phase.

16. The D-Band transmitter of claim 11, wherein each of the second delay line, the third delay line, and the fourth delay line comprises a trace with a meandering configuration.

* * * * *